(12) United States Patent
Wang et al.

(10) Patent No.: US 11,355,425 B2
(45) Date of Patent: Jun. 7, 2022

(54) CHIP ON FILM AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Kaiwen Wang, Beijing (CN); Mookeun Shin, Beijing (CN); Xiaojun Wu, Beijing (CN); Xuanxuan Qiao, Beijing (CN); Aixia Sang, Beijing (CN); Qiang Zhang, Beijing (CN); Zhenyu Han, Beijing (CN)

(73) Assignees: HEFEI XINSHENG OPTOELECTRONICS TECHNOLOGY CO., LTD, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 23 days.

(21) Appl. No.: 16/959,359

(22) PCT Filed: Dec. 13, 2019

(86) PCT No.: PCT/CN2019/125170
§ 371 (c)(1),
(2) Date: Jun. 30, 2020

(87) PCT Pub. No.: WO2020/155885
PCT Pub. Date: Aug. 6, 2020

(65) Prior Publication Data
US 2021/0074615 A1 Mar. 11, 2021

(30) Foreign Application Priority Data
Jan. 29, 2019 (CN) .......................... 201920154341.2

(51) Int. Cl.
*H01L 23/495* (2006.01)
*H01L 27/12* (2006.01)

(52) U.S. Cl.
CPC .... *H01L 23/49572* (2013.01); *H01L 27/1214* (2013.01)

(58) Field of Classification Search
CPC ........... H01L 23/49572; H01L 27/1214; H01L 23/562; H01L 23/4985; H05K 1/02; G02F 1/1345
(Continued)

(56) References Cited

U.S. PATENT DOCUMENTS

2007/0034402 A1* 2/2007 Cheng .................... H05K 1/028
174/260
2017/0154938 A1* 6/2017 Su ........................ H01L 51/5246
(Continued)

FOREIGN PATENT DOCUMENTS

CN 108008556 A 5/2018
CN 108037624 A 5/2018
(Continued)

OTHER PUBLICATIONS

International Search Report of PCT/CN2019/125170 and English translation, dated Mar. 23, 2020, 14 pages.

*Primary Examiner* — Duy T Nguyen
(74) *Attorney, Agent, or Firm* — Muncy, Geissler, Olds & Lowe, P.C.

(57) ABSTRACT

The present disclosure relates to a chip on film and a display device. The chip on film includes a body and an insulating protective film arranged on the body, in which the body includes a first area, a first binding area for binding and connecting to the back surface of the display panel, and a first bendable area located between the first area and the first binding area and capable of being bent in a first direction;
(Continued)

and the insulating protection film includes a first connection area connected to the first area, a second connection area for connecting to the back surface of the display panel, and a second bendable area located between the first connection area and the second connection area and capable of being bent in a second direction opposite to the first direction.

11 Claims, 2 Drawing Sheets

(58) Field of Classification Search
  USPC .......................................................... 257/72
  See application file for complete search history.

(56) References Cited

U.S. PATENT DOCUMENTS

| 2018/0120611 | A1 | 5/2018 | Ko et al. |
| 2019/0064562 | A1* | 2/2019 | Nakui ................. G09F 9/30 |
| 2019/0384092 | A1 | 12/2019 | Zhang |

FOREIGN PATENT DOCUMENTS

| CN | 209167757 U | 7/2019 |
| JP | H08286201 A | 11/1996 |
| JP | H08313924 A | 11/1996 |

* cited by examiner

CHIP ON FILM AND DISPLAY DEVICE

CROSS-REFERENCE TO RELATED APPLICATIONS

This application is the U.S. national phase of PCT Application No. PCT/CN2019/125170 filed on Dec. 13, 2019, which claims a priority to Chinese Patent Application No. 201920154341.2 filed on Jan. 29, 2019, the disclosures of which are incorporated in their entirety by reference herein.

TECHNICAL FIELD

The present disclosure relates to the field of display technology, in particular, to a chip on film and a display device including the chip on film.

BACKGROUND

With the development of the times and technology, high-end display products tend to use full screens. To achieve a full screen, the panel needs to break the constraints of the traditional color film (CF) substrate on the panel, and allow a larger TFT substrate on it. In this full screen, chip on film (COF) bonding is in a reverse folded state.

In order to ensure that there is bezel-free effect on the outer periphery of the full screen, the outer frame of the system needs to be flush with the edge of the panel. This structure results in a too small distance between the chip on film and the outer frame, and the chip on film is subjected to a relatively large pressing stress. Especially, in the process of product transportation, the chip on film is inevitably subjected to a certain stress. When the chip on film is stressed, the bonding area of the chip on film is pulled. Under the effect of long-term pulling stress, the binding area is easy to be pulled and peeled off, which in turn produces chip on film (COF) crack bright lines.

SUMMARY

In one aspect, the present disclosure provides a chip on film, including a body and an insulating protective film arranged on the body, in which the body includes a first area, a first binding area and a first bendable area, the first binding area is configured to be bound and connected to the back surface of the display panel, and the first bendable area is located between the first area and the first binding area and capable of being bent in the first direction; in which the insulating protective film includes a first connection area, a second connection area and a second bendable area, the first connection area is connected to the first area of the body, the second connection area is configured to be connected to the back surface of the display panel, and the second bendable area is located between the first connection area and the second connection area and capable of being bent in a second direction opposite to the first direction.

Optionally, the insulating protective film is made of a flexible insulating material.

Optionally, the flexible insulating material includes PTO8B and XPHM15B2-3830.

Optionally, a thickness of the insulating protective film is in a range of 0.05 mm to 0.1 mm.

Optionally, an insulating glue is used for connecting the first connection area and the first area.

Optionally, the first bendable area is bent so that an angle of about 90° is formed between the first area and the first binding area.

Optionally, the second bendable area is bent so that an angle of about 90° is formed between the first connection area and the second connection area.

Optionally, the first binding area is directly bound or connected to the back surface of the display panel or bound by an insulating glue.

In another aspect, the present disclosure also provides a display device including a display panel and the above-mentioned chip on film.

Optionally, on the back surface of the display panel, a second binding area and a third connection area are sequentially arranged along a direction from a center of the display panel to an edge of the display panel, the first binding area of the body is connected to the second binding area, and the second connection area of the insulating protective film is connected to the third connection area.

Optionally, a length of the second connection area in the direction from the second binding area to the third connection area is in a range of 0.5 mm to 0.8 mm.

Optionally, the display device further includes a main circuit board, and the chip on film further includes a third binding area bound and connected to the main circuit board.

Optionally, a first end of the body includes the first area, the first bendable area, and the first binding area, and a second end of the body opposite to the first end includes a third bendable area and the third binding area.

Optionally, the display device further includes a frame, and an outer surface of the frame in a direction perpendicular to the display surface of the display device is flush with an outer surface of the display panel in a direction perpendicular to the display surface of the display device.

Optionally, the display panel includes an array substrate and a color filter substrate, and the array substrate is arranged in opposite to the color filter substrate on a light exiting side of the display panel.

DETAILED DESCRIPTION

In order to illustrate the purposes, technical solution and advantages in the embodiments of the present disclosure in a clearer manner, the technical solutions in the embodiments of the present disclosure will be described hereinafter in conjunction with the drawings in the embodiments of the present disclosure in a clear and complete manner. Obviously, the following embodiments relate to a part of, rather than all of, the embodiments of the present disclosure. Based on the described embodiments of the present disclosure, a person skilled in the art may obtain the other embodiments, which also fall within the scope of the present disclosure.

Figure 1:
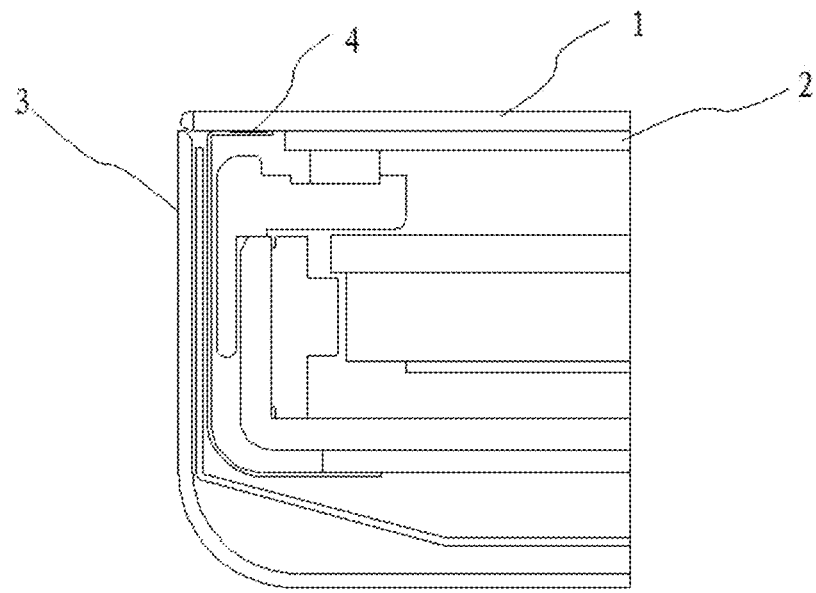
FIG. 1 is a schematic view showing the structure of the display device in the related art.
Figure 2:
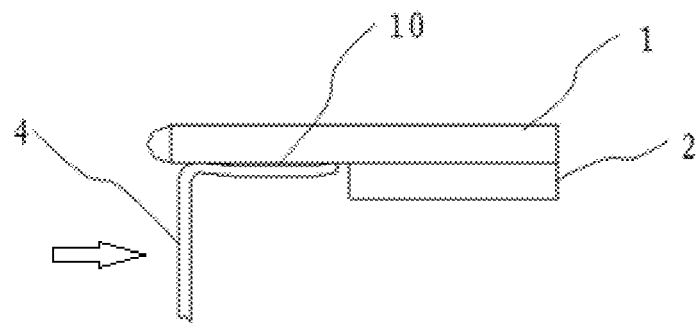
FIG. 2 is a schematic view showing the structure of the state where the binding area of the chip on film is peeled off in the related art.

As shown in FIG. 1 and FIG. 2, in the related bezel-free full-screen product, the array substrate 1 is located above the color filter substrate 2, and the outer side of the frame 3 is flush with the outer side of the edge of the display panel, and the binding area of the thin film 4 is bound and connected to a side of the array substrate 1 facing the color filter substrate 2, that is, the chip on film 4 is in a reverse folded state. In this related product, the chip on film 4 is easily subjected to stress and makes its binding area easily fall off, thereby causing a problem of poor cracks. FIG. 2 shows a state where the chip on film 4 generates cracks due to continuous stress. As can be clearly seen from FIG. 2, a crack 10 is formed between the array substrate 1 and the chip on film. The arrow in FIG. 2 indicates the stress direction of the chip on film 4.

In order to solve the above technical problems, the present disclosure provides a chip on film and a display device using the chip on film, which solves the problem that the chip on film is easy to cause cracks in the binding area due to stress.

In an aspect, the present disclosure provides a chip on film, including a body and an insulating protective film arranged on the body, in which the body includes a first area, a first binding area and a first bendable area, the first binding area is configured to be bound and connected to the back surface of the display panel, and the first bendable area is located between the first area and the first binding area and capable of being bent in the first direction; in which the insulating protective film includes a first connection area, a second connection area and a second bendable area, the first connection area is connected to the first area of the body, and the second connection area is configured to be connected to the back surface of the display panel, and the second bendable area is located between the first connection area and the second connection area and is capable of being bent in a second direction opposite to the first direction.

The "the back surface of the display panel" described in the present disclosure refers to the surface of the display panel away from the display surface (or light emitting surface) of the display panel, or the surface opposite to the display surface (or light emitting surface) of the display panel.

The chip on film described in the embodiments of the present disclosure can produce the following beneficial technical effects: by providing an insulating protective film, the body of the chip on film is protected from falling off due to external stress, thereby preventing or relieving the problem of poor cracks.

Figure 3:
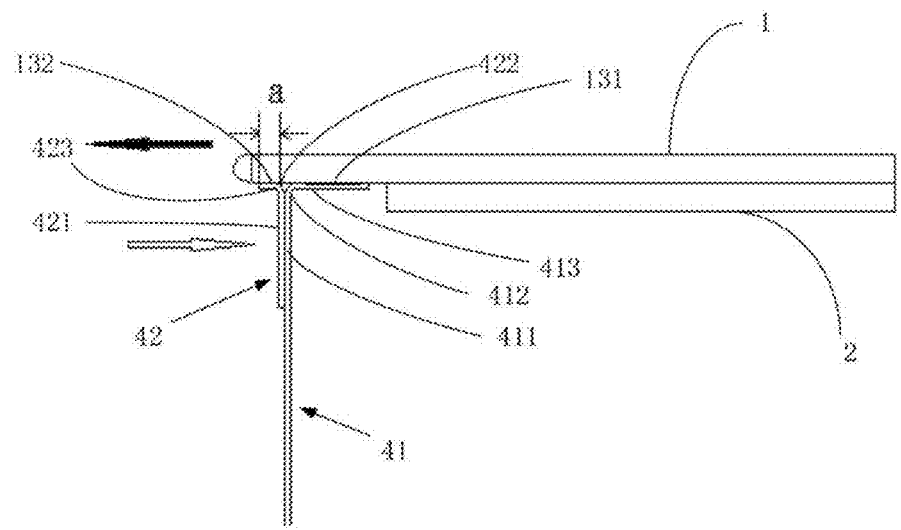
FIG. 3 is a schematic view showing the structure after the chip on film and the panel is assembled according to an embodiment of the present disclosure.

Specifically, as shown in FIG. 3, the chip on film includes a body 41 and an insulating protective film 42 arranged on the body 41. The body 41 includes a first area 411, a first binding area 413 for binding to the back surface of the display panel, and a first bendable area 412 arranged between the first area 411 and the first binding area 413 and capable of being bent in the first direction. The insulating protective film 42 includes a first connection area 421 attached to or connected to the first area 411 of the body, a second connection area 423 for connecting to the back surface of the display panel, and a second bendable area 422 located between the first connection area 421 and the second connection area 423 and capable of being bent in a second direction opposite to the first direction.

Optionally, the first bendable area is bent so that an angle of about 90° is formed between the first area and the first binding area. For example, the angle may be in a range of 88° to 92°.

Optionally, the second bendable area is bent so that an angle of about 90° is formed between the first connection area and the second connection area. For example, the angle may be in a range of 88° to 92°.

As compared with the chip on film in the related art, the chip on film according to the embodiments of the present disclosure has the following beneficial technical effects. Since an insulating protective film is added on the chip on film, the insulating protective film 42 play a function on protecting the body 41 of the chip on film; the bending direction of the first bendable area 412 is opposite to the bending direction of the second bendable area 422, so that the insulating protection film 42 and the body 41 form a back-to-back structure. Thus, when the chip on film is pressed by external stress, the insulating protective film 42 will bear this part of the stress. For example, when the chip on film is subjected to the stress shown by the hollow arrow in FIG. 3, the stress has a tendency to pull and peel off the body 41, but there is no obvious tendency to pull and peel off the insulating protective film 42, so that the insulating protective film 42 protects the body 41 from falling off due to external stress. Therefore, the chip on film of the embodiments of the present disclosure has strong operability, and the bonding connection structure of the chip on film in the bezel-free full-screen product has a significant effect of preventing or relieving COF crack.

In an optional embodiment of the present disclosure, the insulating protective film 42 is made of a flexible insulating material. The flexible insulating material makes the insulating protective film 42 to be flexible and insulating, thereby avoiding short circuit of the circuit on the body 41.

In an optional embodiment of the present disclosure, the flexible insulating material includes but is not limited to PTO8B and XPHM15B2-3830. It should be noted that XPHM15B2-3830 is a flexible insulating material produced by Dongguan Hanpin Electronics Co., Ltd., and it includes a transparent polyester film, a black acrylic adhesive and an isolation film that stacked in this order; PTO8B is a black highlight PET single-sided tape produced by Kunshan Kairen Company, using black highlight polyethylene terephthalate (PET) as the substrate coated with acrylic copolymer black highlight polyethylene terephthalate, and it has good temperature resistance, excellent mechanical properties and electrical insulation properties.

In an optional embodiment of the present disclosure, a thickness of the insulating protection film 42 is in a range of 0.05 mm to 0.1 mm, but it is not limited thereto. For example, the thickness of the insulating protective film 42 can also be selected from 0.01 mm to 0.5 mm, or even 0.02 mm to 0.08 mm. The thickness of the insulating protective film 42 can be set according to actual needs. The thickness of the insulating protective film 42 cannot be too thick, so as not to increase the thickness of the product, but it needs to ensure its strength enough to protect the body 41. In an optional embodiment of the present disclosure, the thickness of the insulating protective film 42 is 0.05 mm.

In an optional embodiment of the present disclosure, the thickness of the body 41 is in a range of 0.05 mm to 0.2 mm, and may even be in a range of 0.08 mm to 0.12 mm. For example, the thickness of the body 41 may be 0.1 mm.

In an optional embodiment of the present disclosure, the first connection area 421 and the first area 411 are connected by insulating glue. The insulating glue further ensures the insulation between the body 41 and the insulating protective film 42.

On the other hand, the present disclosure also relates to a display device including a display panel and the above-mentioned chip on film.

In an optional embodiment of the present disclosure, as shown in FIG. 3, a second binding area 131 and a third connection area 132 are sequentially arranged on the back surface of the display panel along a direction from a center of the display panel to an edge of the display panel, the first binding area 413 of the body is connected to the second binding area 131, and the second connection area 423 of the insulating protective film is connected to the third connection area 132.

Figure 4:
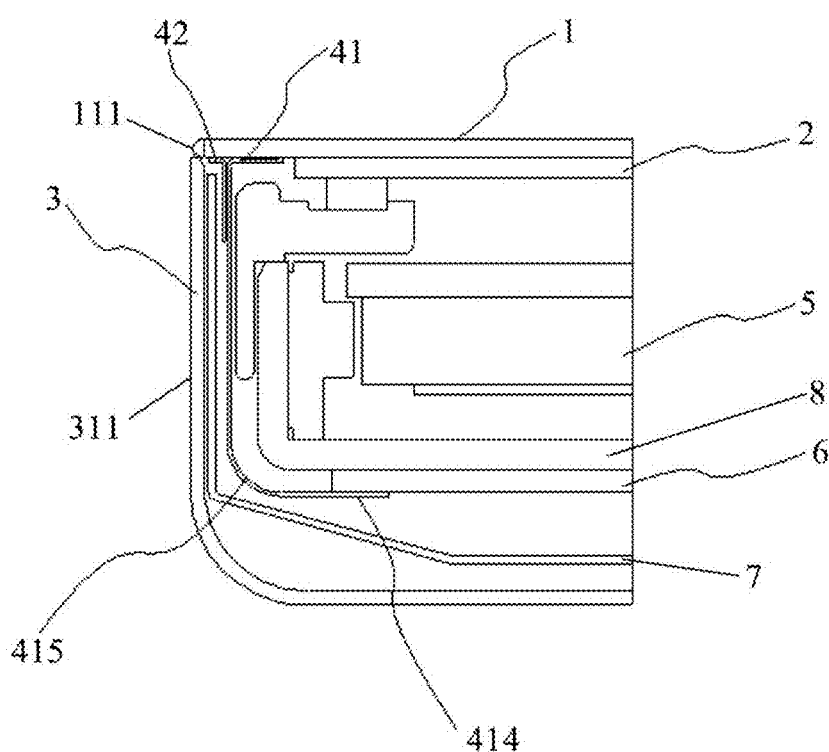
FIG. 4 is a schematic view showing the structure of the display device according to an embodiment of the present disclosure.

Specifically, as shown in FIG. 4, the display device according to an embodiment of the present disclosure includes a display panel and the above-mentioned chip on film.

Optionally, a second binding area and a third connection area are sequentially arranged on the back surface of the display panel along the direction from the center of the display surface of the display panel to the edge of the display surface, the first binding area 413 is connected to the second binding area, and the second connection area 423 is connected to the third connection area.

The display panel includes an array substrate 1 and a color filter substrate 2. The array substrate 1 is located above the color filter substrate 2, that is, the surface of the array substrate 1 away from the color filter substrate 2 is the display surface (or light exiting side) of the display panel. The second binding connection area and the third connection area are both arranged on the array substrate 1 and located on a surface of the array substrate 1 facing the color filter substrate 2.

The insulating protective film 42 functions to protect the body 41 of the chip on film. Moreover, the bending direction of the first bendable area 412 is opposite to the bending direction of the second bendable area 422, so that the insulating protective film 42 and the body 41 form a back-to-back structure. Therefore, when the chip on film is pressed by external stress, the insulating protective film 42 will bear this part of the stress. For example, when a stress in the direction indicated by the hollow arrow in FIG. 3 is applied, the stress has a tendency to pull and peel off the body 41, but there is no obvious tendency to pull and peel off the insulating protective film 42, so that the insulating protective film 42 protects the body 41 from falling off due to external stress. The chip on film according to the embodiments of the present disclosure has strong operability, and the bonding connection structure of the chip on film in the bezel-free full-screen product has a significant effect of preventing or relieving COF crack.

In an optional embodiment of the present disclosure, as shown in FIG. 3, in the direction from the second binding area to the third connection area (hereinafter referred to as the third direction, as indicated by the solid arrow in FIG. 3), the length a of the second connection area 423 is in a range of 0.1 mm to 1.0 mm, optionally in a range of 0.5 mm to 0.8 mm.

The second connection area 423 is connected to the third connection area. As shown in FIG. 4, since the side end surface 311 of the frame 3 of the display device is flush with the end surface 111 of the same side of the display panel, in order to avoid interference between the insulating protective film 42 and the frame 3, the second connection area 423 is located between the second binding area and the frame 3 of the display device. That is, in the direction from the center of the display surface of the display panel to the edge of the display surface (or in the third direction), the length of the second connection area 423 cannot be too large. In an optional embodiment of the present disclosure, the length of the second connection area 423 in the third direction is in a range of 0.1 mm to 1.0 mm, optionally in a range of 0.5 mm to 0.8 mm. This length range ensures the connection stability between the second connection area 423 and the third connection area.

It should be noted that the length of the second connection area 423 in the third direction is not limited to the above length range. In actual application, the length may be specifically set according to the actual sizes of the second binding area and the frame 3 of the display device.

In an optional embodiment of the present disclosure, the display device further includes a main circuit board 6, and the chip on film further includes a third binding area 414 connected to the main circuit board 6.

As shown in FIGS. 3 and 4, the first end of the body 41 includes the first area 411, the first bendable area 412 and the first binding area 413; and the second end opposite to the first end includes a third bendable area 415 and the third binding area 414.

In an optional embodiment of the present disclosure, as shown in FIG. 4, the display device further includes a frame 3, a light guide plate 5, a backplane 8, a main printed circuit board 6 (PCB) and its cover 7 (PCB cover), and the side end surface 311 of the frame 3 is flush with the end surface 111 of the display panel on the same side. If the side end surface 311 of the frame 3 and the end surface 111 on the same side of the display panel are curved surfaces, the top tangent of each curved surface is aligned. The technical solution that the outer side 311 of the frame 3 is flush with the outer side 111 of the display panel achieves the display effect of the bezel-free full screen. Further, the display panel includes an array substrate (TFT substrate) and a color filter substrate (CF substrate), and the array substrate is arranged on the light emitting side or outside of the display panel opposite to the color filter substrate.

The display device may include any product or component having a display function, such as a liquid crystal television, a liquid crystal display, a digital photo frame, a mobile phone, and a tablet computer. The display device further includes a flexible circuit board, a printed circuit board, and a backplane, which have application value in augmented reality (AR)/virtual reality (VR) and other fields in the future.

The above descriptions are alternative embodiments of the present disclosure. It should be noted that a person skilled in the art would make several improvements and substitutions without departing from the principles of the present disclosure. These improvements and modifications should also be regarded as the protection scope of the present disclosure.

What is claimed is:

1. A display device comprising a display panel and a chip on film, wherein the chip on film comprises a body and an insulating protective film arranged on the body,
   wherein the body comprises a first area, a first binding area and a first bendable area, the first binding area is configured to be bound and connected to a back surface of the display panel, and the first bendable area is located between the first area and the first binding area and capable of being bent in a first direction,
   wherein the insulating protective film comprises a first connection area, a second connection area and a second bendable area, the first connection area is connected to the first area of the body, the second connection area is configured to be connected to the back surface of the display panel, and the second bendable area is located between the first connection area and the second connection area and capable of being bent in a second direction opposite to the first direction, and
   wherein the display device further comprises a frame, and an outer surface of the frame in a direction perpendicular to a display surface of the display device is flush with an outer surface of the display panel in a direction perpendicular to the display surface of the display device.

2. The display device of claim 1, wherein on the back surface of the display panel, a second binding area and a third connection area are sequentially arranged along a direction from a center of the display panel to an edge of the display panel, the first binding area of the body is connected to the second binding area, and the second connection area of the insulating protective film is connected to the third connection area.

3. The display device of claim 2, wherein a length of the second connection area in the direction from the second binding area to the third connection area is in a range of 0.5 mm to 0.8 mm.

4. The display device of claim 1, wherein the display device further comprises a main circuit board, and the chip on film further comprises a third binding area connected to the main circuit board.

5. The display device of claim 1, wherein a first end of the body comprises the first area, the first bendable area, and the first binding area, and a second end of the body opposite to the first end comprises a third bendable area and a third binding area.

6. The display device of claim 1, wherein the display panel comprises an array substrate and a color filter substrate, and the array substrate is arranged opposite to the color filter substrate on a light exiting side of the display panel.

7. The display device of claim 1, wherein the insulating protective film is made of a flexible insulating material.

8. The display device of claim 1, wherein a thickness of the insulating protective film is in a range of 0.05 mm to 0.1 mm.

9. The display device of claim 1, wherein an insulating glue is used for connecting the first connection area and the first area.

10. The display device of claim 1, wherein the first bendable area is bent so that an angle of about 90° is formed between the first area and the first binding area, and the second bendable area is bent so that an angle of about 90° is formed between the first connection area and the second connection area.

11. The display device of claim 1, wherein the first binding area is directly bound or connected to the back surface of the display panel or bound by an insulating glue.

* * * * *